United States Patent
Kwon et al.

(10) Patent No.: US 10,566,351 B2
(45) Date of Patent: Feb. 18, 2020

(54) DISPLAY DEVICE AND METHOD FOR MANUFACTURING THE SAME

(71) Applicant: SAMSUNG DISPLAY CO., LTD., Yongin, Gyeonggi-Do (KR)

(72) Inventors: So Ra Kwon, Cheonan-si (KR); Jae Kyung Go, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 358 days.

(21) Appl. No.: 14/706,885

(22) Filed: May 7, 2015

(65) Prior Publication Data

US 2016/0035274 A1 Feb. 4, 2016

(30) Foreign Application Priority Data

Aug. 1, 2014 (KR) .......................... 10-2014-0099254

(51) Int. Cl.
  *H01L 27/12* (2006.01)
(52) U.S. Cl.
  CPC .................................. *H01L 27/124* (2013.01)
(58) Field of Classification Search
  None
  See application file for complete search history.

(56) References Cited

U.S. PATENT DOCUMENTS

| 2007/0083784 A1* | 4/2007 | Park ................... H01L 27/3276 713/321 |
| 2007/0252790 A1* | 11/2007 | Jung ................... H01L 27/3276 345/76 |
| 2008/0012474 A1* | 1/2008 | Sung ................... H01L 27/3276 313/504 |
| 2009/0009068 A1* | 1/2009 | Fujimura ............ H01L 27/3276 313/504 |
| 2011/0291119 A1* | 12/2011 | Ryu ..................... H01L 27/3276 257/88 |
| 2013/0069853 A1 | 3/2013 | Choi |
| 2014/0139796 A1* | 5/2014 | Cao .................... G02F 1/136204 349/139 |

FOREIGN PATENT DOCUMENTS

| KR | 10-2011-0070565 A | 6/2011 |
| KR | 10-2013-0031101 A | 3/2013 |
| KR | 10-2013-0107050 A | 10/2013 |

* cited by examiner

*Primary Examiner* — Amare Mengistu
*Assistant Examiner* — Sarvesh J Nadkarni
(74) *Attorney, Agent, or Firm* — Lewis Roca Rothgerber Christie LLP

(57) ABSTRACT

A display device includes a substrate including a display area and a non-display area, and a common electrode line at the non-display area of the substrate. The common electrode line may include a line unit and a plurality of protrusions that protrude from the line unit in a direction opposite from the display area.

19 Claims, 17 Drawing Sheets

DISPLAY DEVICE AND METHOD FOR MANUFACTURING THE SAME

CROSS-REFERENCE TO RELATED APPLICATION

This application claims priority to and the benefit of Korean Patent Application No. 10-2014-0099254, filed in the Korean Intellectual Property Office on Aug. 1, 2014, the entire content of which is incorporated herein by reference.

BACKGROUND

1. Field

Embodiments of the present invention relate to a display device including a common electrode line having a protrusion, and a method for manufacturing the same.

2. Description of the Related Art

Flat panel displays such as liquid crystal displays (LCDs) and organic light-emitting diode (OLED) displays include a pair of electric field generating electrodes and an electro-optical active layer interposed therebetween. A liquid crystal layer is included as the electro-optical active layer in LCDs and an organic emission layer is included as the electro-optical active layer in OLED displays.

At least one pixel electrode and at least one counter electrode are used to drive an electro-optical active layer. The pixel electrodes are categorized according to a pixel (e.g., correspond to a respective pixel) and the counter electrodes face the pixel electrodes. The counter electrodes can be replaced with common electrodes that are provided or disposed for all pixels.

A common electrode line is used to provide the common electrode with power. The common electrode line is usually located or disposed outside of a display unit where a pixel is located or disposed and it is made of a metal having low resistance in order to reduce or prevent IR-drop (e.g., voltage drop).

A patterning process is repeatedly performed in a manufacturing process of a display device, however, which results in damage to the common electrode line.

It is to be understood that this background section is intended to provide useful background for understanding the subject matter disclosed herein and as such, the background section may include ideas, concepts or recognitions that were not part of what was known or appreciated by those skilled in the pertinent art prior to the corresponding effective filing dates of the subject matter disclosed herein.

SUMMARY

Aspects of embodiments of the present invention are directed toward a display device including a common electrode line having a protrusion.

Further, aspects of embodiments of the present invention are directed toward a method for manufacturing a display device including a common electrode line having a protrusion.

According to an embodiment of the present invention, a display device includes a substrate including a display area and a non-display area, and a common electrode line in the non-display area of the substrate. The common electrode line may include a line unit and a plurality of protrusions that protrude from the line unit in a direction opposite from the display area.

The common electrode line may include a metal.

The display area may include a thin film transistor including a gate electrode, a semiconductive layer, a source electrode, and a drain electrode, and the common electrode line may include substantially the same material as the source and drain electrodes.

The plurality of protrusions may be spaced apart from each other by a set distance.

The plurality of protrusions may be spaced apart from each other by different distances.

Each of the plurality of protrusions may have a set length and the length may be larger than the distance between the adjacent protrusions.

The length may be in a range of 2 μm to 2000 μm.

The protrusion may have a polygonal or semicircular shape.

The display area may include a display element including a pixel electrode on the substrate, a light emission layer on the pixel electrode, and a common electrode on the light emission layer. The common electrode may be coupled to the common electrode line.

The display device may further include a common electrode coupling portion coupled to the common electrode line.

The common electrode coupling portion may include substantially the same material as the pixel electrode.

The display device may further include a pixel defining layer on the substrate to define a pixel area. The pixel electrode and the light emission layer may be in the pixel area.

According to another embodiment of the present invention, a method for manufacturing a display device includes forming a display area and a non-display area on a substrate, and forming a common electrode line in the non-display area on the substrate. The common electrode line may include a line unit and a plurality of protrusions that protrude from the line unit in a direction opposite from the display area.

The forming of the display area may include forming a thin film transistor on the substrate, and the forming of the thin film transistor may include forming a semiconductive layer, forming a gate electrode that overlaps at least a portion of the semiconductive layer, and forming a source electrode coupled to the semiconductive layer and a drain electrode spaced apart from the source electrode and coupled to the semiconductive layer. The forming of the source electrode and the drain electrode may be performed utilizing substantially the same process as the forming of the common electrode line.

The forming of the display area may include forming one or more display elements. The forming of the one or more display elements may include forming a pixel electrode on the substrate, forming a light emission layer on the pixel electrode, and forming a common electrode on the light emission layer. The common electrode may be coupled to the common electrode line.

The forming of the pixel electrode may further include forming a common electrode coupling portion coupled to the common electrode line.

The method may further include forming a pixel defining layer after the forming of the pixel electrode.

The plurality of protrusions may be spaced apart from each other by a set distance.

The plurality of protrusions may be spaced apart from each other by different distances.

The protrusion may have a polygonal or semicircular shape.

Each of the plurality of protrusions may have a set length and the length may be larger than the distance between the adjacent protrusions.

The length may be in a range of 2 μm to 2000 μm.

According to embodiments of the present invention, a display device includes a common electrode line having a protrusion. Accordingly, when a layer is formed in a manufacturing process of a display device, a layer-forming material may be evenly or substantially evenly applied to form a uniform or substantially uniform layer.

Further, according to embodiments of the present invention, a display device is manufactured to include a common electrode line having a protrusion.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other objects, features and other enhancements of embodiments of the present invention will be more clearly understood from the following detailed description when considered together with the accompanying drawings, in which.

DETAILED DESCRIPTION

Figure 1:
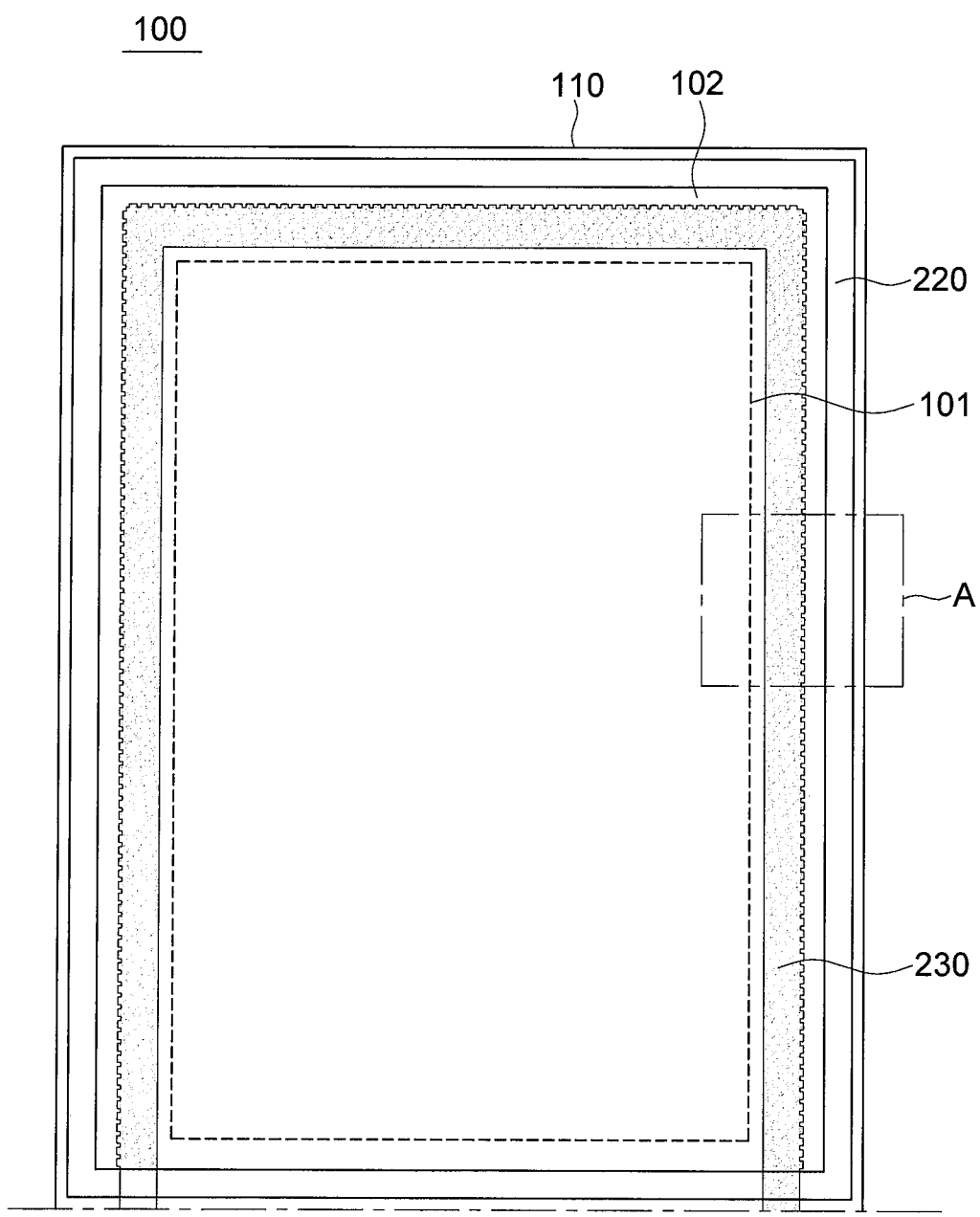
FIG. 1 is a plan view illustrating a display device according to a first embodiment of the present invention.

Aspects of embodiments of the present invention will be described with reference to embodiments illustrated in the accompanying drawings. However, the embodiments disclosed in the drawings and the detailed description are not intended to limit the scope of the present invention.

The accompanying drawings are selected only for illustrative purposes for embodiments of the present invention. Each element and its shape in the drawings may be schematically or exaggeratedly illustrated to help with understanding embodiments of the invention. Some elements provided for a commercial embodiment may not be illustrated or may be omitted in the drawings or the description as those elements should be apparent to one of ordinary skill in the art. The drawings should be construed to help the understanding of the invention. Like reference numerals may refer to like elements in the specification.

In the specification, when a first element is referred to as being "coupled" or "connected" to a second element, the first element may be directly connected to the second element or indirectly connected to the second element with one or more intervening elements interposed therebetween. The terms "comprises," "comprising," "includes," and/or "including," when used in this specification, may specify the presence of the stated features, integers, acts, operations, elements, and/or components, but do not preclude the presence or addition of one or more other features, integers, acts, operations, elements, and/or components.

It will be understood that when an element is referred to as being "on", "over", "disposed on", "disposed over", "deposited on", or "deposited over" another element, it can be directly on or over the other element or indirectly on or over the other element with one or more intervening elements interposed therebetween. Expressions such as "at least one of," when preceding a list of elements, modify the entire list of elements and do not modify the individual elements of the list. Further, the use of "may" when describing embodiments of the present invention refers to "one or more embodiments of the present invention."

Hereinafter, a first embodiment of the present invention will be described with reference to FIGS. 1 to 3.

FIG. 1 is a plan view illustrating a display device according to the first embodiment of the present invention. FIG. 2 is an enlarged partial view of part "A" of FIG. 1. FIG. 3 is a cross-sectional view taken along the line I-I' in FIG. 2.

As illustrated in FIG. 1, an organic light emitting diode (OLED) display 100 according to the first embodiment includes a substrate 110 having a display area 101 and a non-display area 102. The present disclosure, however, is not limited to OLED displays.

The display area 101 of the substrate 110 may include a plurality of pixels so as to display an image.

A common electrode line 230 may be disposed in the non-display area 102. The common electrode line 230 may be spaced apart from the display area 101 and may be located or disposed along an edge of the display area 101. The common electrode line 230 may have a protrusion.

Further, a sealing area 220 may be located or disposed more outwards than the common electrode line 230.

Figure 2:
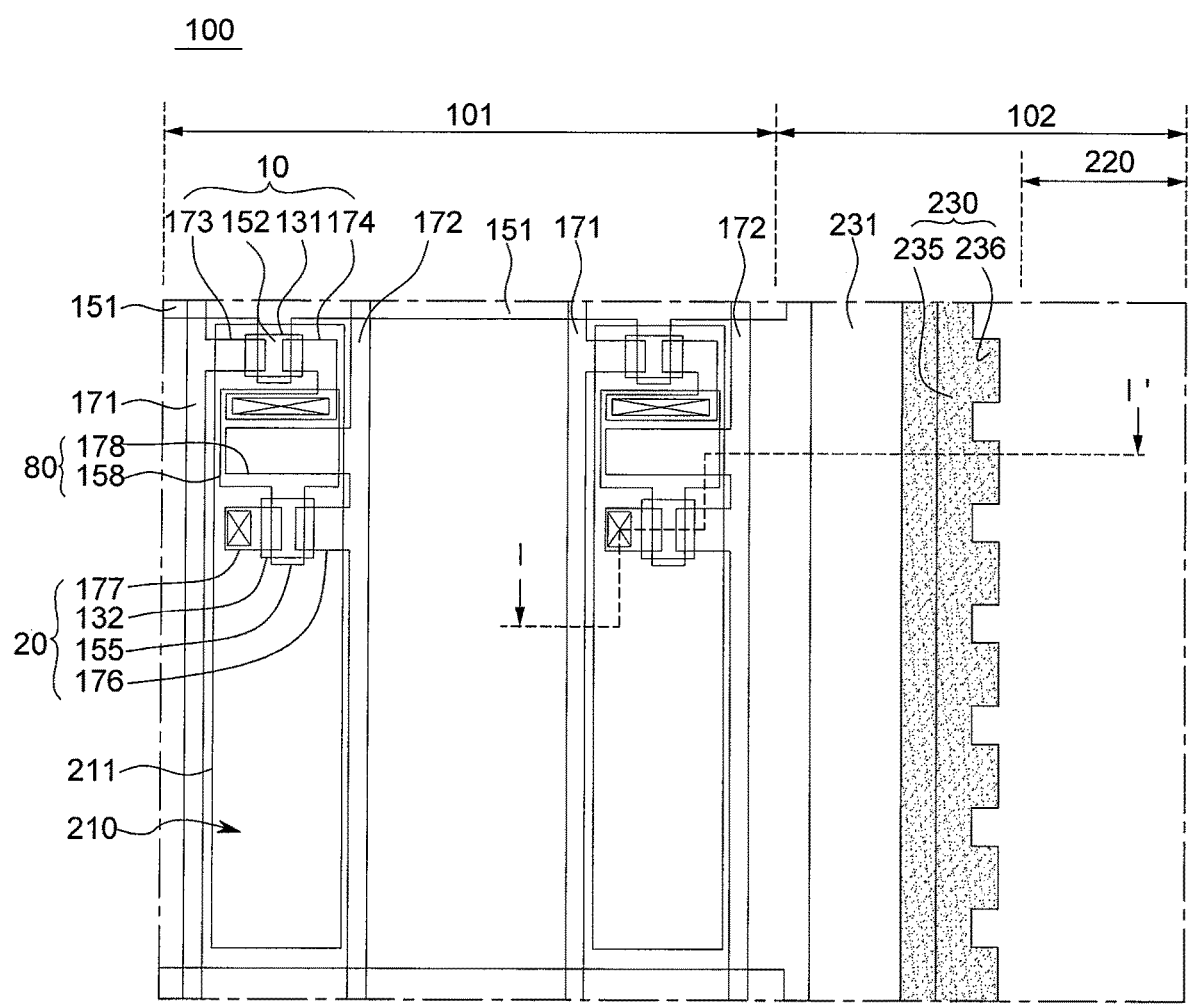
FIG. 2 is an enlarged partial view of part "A" of FIG. 1.
Figure 3:
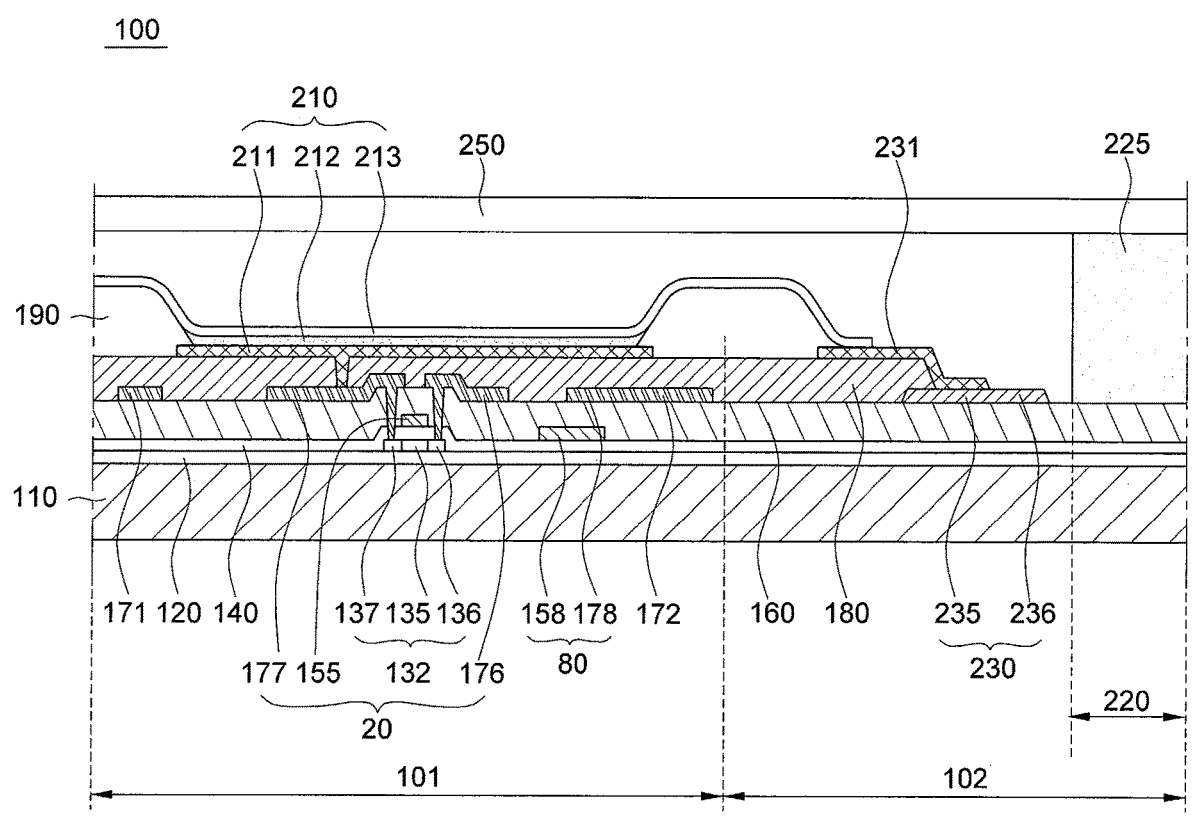
FIG. 3 is a cross-sectional view taken along the line I-I' in FIG. 2.

Referring to FIGS. 2 and 3, the OLED display 100 according to the first embodiment includes a plurality of pixels that are disposed in the display area 101 and that include a switching thin film transistor (TFT) 10, a driving TFT 20, a capacitor 80, and an organic light emitting diode (OLED) 210. Herein, the term "pixel" refers to the smallest unit for displaying an image. The OLED display 100 displays an image utilizing a plurality of pixels.

Although FIG. 2 illustrates an OLED display with a 2Tr-1 Cap structure, which includes two TFTs 10 and 20 (e.g., a switching TFT 10 and a driving TFT 20) and a capacitor 80 in one pixel, embodiments of the present invention are not limited thereto. For example, the OLED display according to one embodiment may include three or more TFTs and/or two or more capacitors in one pixel, and may further include conductive lines. The OLED display according to one embodiment may have many different structures.

The OLED display 100 may further include a gate line 151 on the substrate 110, and a data line 171 and power line 172 which are insulated from and intersect (cross) the gate line 151. One pixel may be defined by the gate line 151, the data line 171, and the power line 172, but it may be differently defined. For example, the pixel may be defined by a black matrix or a pixel defining layer (PDL).

The substrate 110 may include or be an insulating substrate made of glass, quartz, ceramic, plastic, and/or the like, but embodiments of the present invention are not limited thereto. The substrate 110 may include or be a metal substrate made of stainless steel, etc., or the substrate 110 may include or be made of any other suitable material available in the art of display devices.

A buffer layer 120 may be disposed on the substrate 110. The buffer layer 120 may reduce or prevent infiltration of undesirable elements such as impurities and moisture and may provide a planar surface. The buffer layer 120 may include or be made of a suitable material for planarizing and/or preventing or reducing infiltration. For example, the buffer layer 120 may include one or more of silicon nitride ($SiN_x$), silicon oxide ($SiO_2$), or silicon oxynitride ($SiO_xN_y$, e.g., $Si_2N_2O$). In an implementation, the buffer layer 120 may be omitted depending on the kind and process condition of the substrate 110.

Switching and driving semiconductive layers 131 and 132 (e.g., a switching semiconductive layer 131 and a driving semiconductive layer 132) may be disposed on the buffer layer 120. The switching and driving semiconductive layers 131 and 132 may include or be made of one or more of, e.g., polycrystalline silicon, amorphous silicon, or an oxide semiconductor such as Indium Gallium Zinc Oxide (IGZO) and Indium Zinc Tin Oxide (IZTO). For example, in the case of the driving semiconductive layer 132 illustrated in FIG. 3 including or being made of polycrystalline silicon, the driving semiconductive layer 132 may include a channel area 135 that is not doped with impurities, and p+ doped source and drain areas 136 and 137 on respective sides of the channel area 135. In this case, p-type impurities such as boron B may be used as dopant ions. For example, $B_2H_6$ may be used. Such impurities may vary depending on the kind of the TFTs. According to the first embodiment of the present invention, a PMOS-structured TFT using the p-type impurities is utilized as the driving TFT 20, but embodiments of the present invention are not limited thereto. For example, an NMOS-structured or CMOS-structured TFT may be used as the driving TFT 20.

A gate insulating layer 140 may be disposed on the switching and driving semiconductive layers 131 and 132. The gate insulating layer 140 may include one or more of, e.g., tetraethyl orthosilicate (TEOS), silicon nitride ($SiN_x$, where 0<x<4/3), or silicon oxide ($SiO_2$). In an implementation, the gate insulating layer 140 may have a double layer structure in which a silicon nitride layer having a thickness of about 40 nm and a TEOS layer having a thickness of about 80 nm are sequentially laminated.

A gate wire that includes gate electrodes 152 and 155 (e.g., a switching gate electrode 152 and a driving gate electrode 155) may be disposed on the gate insulating layer 140. The gate wire may further include a gate line 151, a first capacitor plate 158, and other conductive lines. The gate electrodes 152 and 155 may be disposed to overlap at least part of the semiconductive layers 131 and 132, e.g., to overlap the channel area. The gate electrodes 152 and 155 may prevent the channel area from being doped with impurities (or reduce such doping) when the source and drain areas 136 and 137 of the semiconductive layers 131 and 132 are doped with the impurities in the process of forming the semiconductive layers 131 and 132.

The gate electrodes 152 and 155 and the first capacitor plate 158 may be disposed on the same layer and may include or be made of substantially the same metal material. For example, the gate electrodes 152 and 155 and the first capacitor plate 158 may include at least one selected from molybdenum (Mo), chromium (Cr), and tungsten (W).

An interlayer insulating layer 160 configured to cover the gate electrodes 152 and 155 may be disposed on the gate insulating layer 140. The interlayer insulating layer 160 may include or be made of tetraethyl orthosilicate (TEOS), silicon nitride ($SiN_x$), or silicon oxide ($SiO_x$, where 0<x≤2), similarly to the gate insulating layer 140, but embodiments of the present invention are not limited thereto.

A data wire including source electrodes 173 and 176 (e.g., a switching source electrode 173 and a driving source electrode 176) and drain electrodes 174 and 177 (e.g., a switching drain electrode 174 and a driving drain electrode 177) may be disposed on the interlayer insulating layer 160. The data wire may further include a data line 171, a power line 172, a second capacitor plate 178, and other conductive lines. The source electrode 176 and the drain electrode 177 may be respectively coupled to the source area 136 and the drain area 137 of the semiconductive layer 132 through contact openings (e.g., holes).

Thus, the switching TFT 10 may include the switching semiconductive layer 131, the switching gate electrode 152, the switching source electrode 173, and the switching drain electrode 174, and the driving TFT 20 may include the driving semiconductive layer 132, the driving gate electrode 155, the driving source electrode 176, and the driving drain electrode 177. The configurations of the TFTs 10 and 20 are not limited to the above-described embodiment and may vary according to other configurations that should be apparent to those of ordinary skill in the art.

The capacitor 80 may include the first capacitor plate 158 and the second capacitor plate 178 with the interlayer insulating layer 160 interposed therebetween.

The switching TFT 10 may function as a switching device that selects a pixel to emit light. The switching gate electrode 152 may be coupled to the gate line 151. The switching source electrode 173 may be coupled to the data line 171. The switching drain electrode 174 may be spaced apart from the switching source electrode 173 and may be coupled to the first capacitor plate 158.

The driving TFT 20 may apply a driving power to a pixel electrode 211 to enable a light emission layer 212 of the OLED 210 in a selected pixel to emit light. The driving gate electrode 155 may be coupled to the first capacitor plate 158. The driving source electrode 176 and the second capacitor plate 178 may be coupled to the power line 172. The driving drain electrode 177 may be coupled to the pixel electrode 211 of the OLED 210 through a contact hole.

The switching TFT 10 may be operated by a gate voltage applied to the gate line 151, and may function to transmit a data voltage applied to the data line 171 to the driving TFT 20. A voltage equivalent to a differential between a common voltage applied to the driving TFT 20 from the power line 172 and the data voltage transmitted from the switching TFT 10 may be stored in the capacitor 80. A current that corresponds to the voltage stored in the capacitor 80 may flow to the OLED 210 through the driving TFT 20 so that the OLED 210 may emit light.

On the interlayer insulating layer 160 of the non-display area 102, the common electrode line 230 may be located or disposed more inward than the sealing area 220. The common electrode line 230 may include or be made of the same or substantially the same material as the source electrodes 173 and 176 and the drain electrodes 174 and 177.

The source electrodes 173 and 176, the drain electrodes 174 and 177, and the common electrode line 230 may include or be made of a metal material. Examples of the metal material may include molybdenum (Mo), chromium (Cr), tungsten (W), aluminum (Al), and/or copper (Cu) and the metals may be used alone or in combination with each other. The source electrodes 173 and 176, the drain electrodes 174 and 177, and the common electrode line 230 may have a single layer structure or a multilayer structure.

As illustrated in FIG. 2, the common electrode line 230 may include a line unit 235 and a protrusion 236.

A planarization layer 180 may be disposed on the interlayer insulating layer 160 and may be configured to cover the data wire (171, 172, 173, 174, 176, 177, and 178). The planarization layer 180 may serve to planarize a surface of the OLED 210 that is disposed on the planarization layer 180 by eliminating or reducing steps (e.g., defects) so as to increase light emission efficiency of the OLED 210. The planarization layer 180 may have a pixel contact opening (e.g., hole) through which part of the drain electrode 177 is exposed.

The planarization layer 180 may include or be made of at least one selected from a polyacrylate resin, an epoxy resin, a phenolic resin, a polyamide resin, a polyimide resin, an unsaturated polyester resin, a polyphenylenether resin, a polyphenylene sulfide resin, and benzocyclobutene (BCB).

The pixel electrode 211 of the OLED 210 may be disposed on the planarization layer 180. The pixel electrode 211 may be coupled to the drain electrode 177 through the contact opening (e.g., hole) of the planarization layer 180.

The pixel electrode 211 may be any one of the following types or kinds: a transmissive type or kind, a transflective type or kind, and a reflective type or kind.

A transparent conductive oxide (TCO) may be used to form the pixel electrode 211 to be a transmissive electrode. Examples of the TCO may include indium tin oxide (ITO), indium zinc oxide (IZO), zinc oxide (ZnO), and/or indium oxide ($In_2O_3$).

A metal such as magnesium (Mg), silver (Ag), gold (Au), calcium (Ca), lithium (Li), chromium (Cr), aluminum (Al), and/or copper (Cu), and/or alloys thereof may be used to form a transflective electrode and/or a reflective electrode. In this case, the transflective electrode and the reflective electrode may have different thicknesses. For example, the transflective electrode may have a thickness of about 200 nm or less and the reflective electrode may have a thickness of about 300 nm or greater. As the thickness of the transflective electrode decreases, both light transmittance and resistance may increase. Conversely, as the thickness of the transflective electrode increases, light transmittance may decrease.

The transflective electrode and/or the reflective electrode may have a multilayer structure that includes a metal layer made of a metal or an alloy thereof and a transparent conductive oxide layer laminated on the metal layer.

According to the kind of materials included in the pixel electrode 211 and a common electrode 213, the OLED display 100 may be classified into three types or kinds: a top emission type or kind; a bottom emission type or kind; and a dual-side emission type or kind. According to the first embodiment, the OLED display 100 is a top emission device. For example, the OLED 210 may emit light in a direction of the common electrode 213 so as to display an image. In order to improve light emission efficiency of the top emission OLED display 100, the pixel electrode 211 may be a reflective electrode. Examples of the reflective electrode may include an electrode having a structure in which a transparent conductive oxide layer made of ITO is laminated on a metal layer including or made of silver (Ag). The reflective electrode may also have a triple-layered structure in which silver (Ag), ITO, and silver (Ag) are sequentially laminated.

In the meantime, a common electrode coupling portion 231 may be disposed on the planarization layer 180 of the non-display area 102. The common electrode coupling portion 231 may extend from an upper portion of the planarization layer 180 to the common electrode line 230 so as to allow the common electrode line 230 to have an enlarged contact area. The common electrode coupling portion 231 may have the same or substantially the same composition and configuration as the pixel electrode 211 and also may be formed by the same or substantially the same process as the pixel electrode 211.

A pixel defining layer (PDL) 190 may be disposed on the planarization layer 180 and may have an opening through which at least part of the pixel electrode 211 is exposed. The pixel electrode 211 may be disposed in a pixel area defined by the PDL 190. In this case, the common electrode coupling portion 231 may be partially covered by the PDL 190 and another part of the common electrode coupling portion 231 may be exposed.

The PDL 190 may include or be made of a polyacrylate resin, a polyimide resin, and/or the like.

The light emission layer 212 may be disposed on the pixel electrode 211 in the pixel area and the common electrode 213 may be disposed on the PDL 190 and the light emission layer 212. The common electrode 213 may be in contact (e.g., direct contact) with the common electrode coupling portion 231, and thus, the common electrode 213 may be electrically coupled or connected to the common electrode line 230.

The light emission layer 212 may include a low molecular weight organic material or a high molecular weight organic material. At least one selected from a hole injection layer (HIL) and a hole transport layer (HTL) may be disposed between the pixel electrode 211 and the light emission layer 212, and at least one selected from an electron transport layer (ETL) and an electron injection layer (EIL) may be disposed between the light emission layer 212 and the common electrode 213.

The common electrode 213 may be formed as a transflective layer. The transflective layer used as the common electrode 213 may include or be made of at least one metal including magnesium (Mg), silver (Ag), calcium (Ca), lithium (Li), chromium (Cr), aluminum (Al) and/or copper (Cu). The common electrode 213 may have a multilayer structure that includes a metal layer including at least one of magnesium (Mg), silver (Ag), calcium (Ca), lithium (Li), chromium (Cr), aluminum (Al) and/or copper (Cu), and a transparent conductive oxide (TCO) layer laminated on the metal layer.

As described above, the OLED 210 may include the pixel electrode 211, the light emission layer 212 on the pixel electrode 211, and the common electrode 213 on the light emission layer 212. Herein, the pixel electrode 211 may serve as an anode, which may be a hole injection electrode, and the common electrode 213 may serve as a cathode, which may be an electron injection electrode. However, embodiments of the present invention are not limited thereto, and thus, the pixel electrode 211 may be a cathode and the common electrode 213 may be an anode according to a driving method of the OLED display 100.

A sealing member 250 may be disposed on a sealing layer 225 so as to cover the driving TFT 20 and the OLED 210.

A transparent insulating substrate including or made of glass or plastic may be utilized as the sealing member 250.

In further detail, the sealing member 250 may face the substrate 110 by way of the sealing layer 225 that is disposed in the sealing area 220 on the substrate 110.

The sealing member 250 may be spaced apart from the substrate 110 by the sealing layer 225 in the sealing area 220. The sealing layer 225 may include or be made of, for example, sealants and/or frits.

The first embodiment has been described hereinabove with reference to FIGS. 1 to 3, but embodiments of the present invention are not limited thereto.

In one embodiment, a thin film encapsulation layer in which organic and inorganic layers are alternately laminated may be disposed on the OLED 210. In this case, the sealing member 250 and the sealing layer 225 may be omitted. Further, many different conductive lines, which extend from the display area 101 to the non-display area 102, may be insulatedly disposed between the sealing layer 225 and the substrate 110 so as to provide signals and/or power.

Hereinafter, another example of a pixel configuration of the display device according to the first embodiment will be described with reference to FIGS. 4 and 5.

Figure 4:
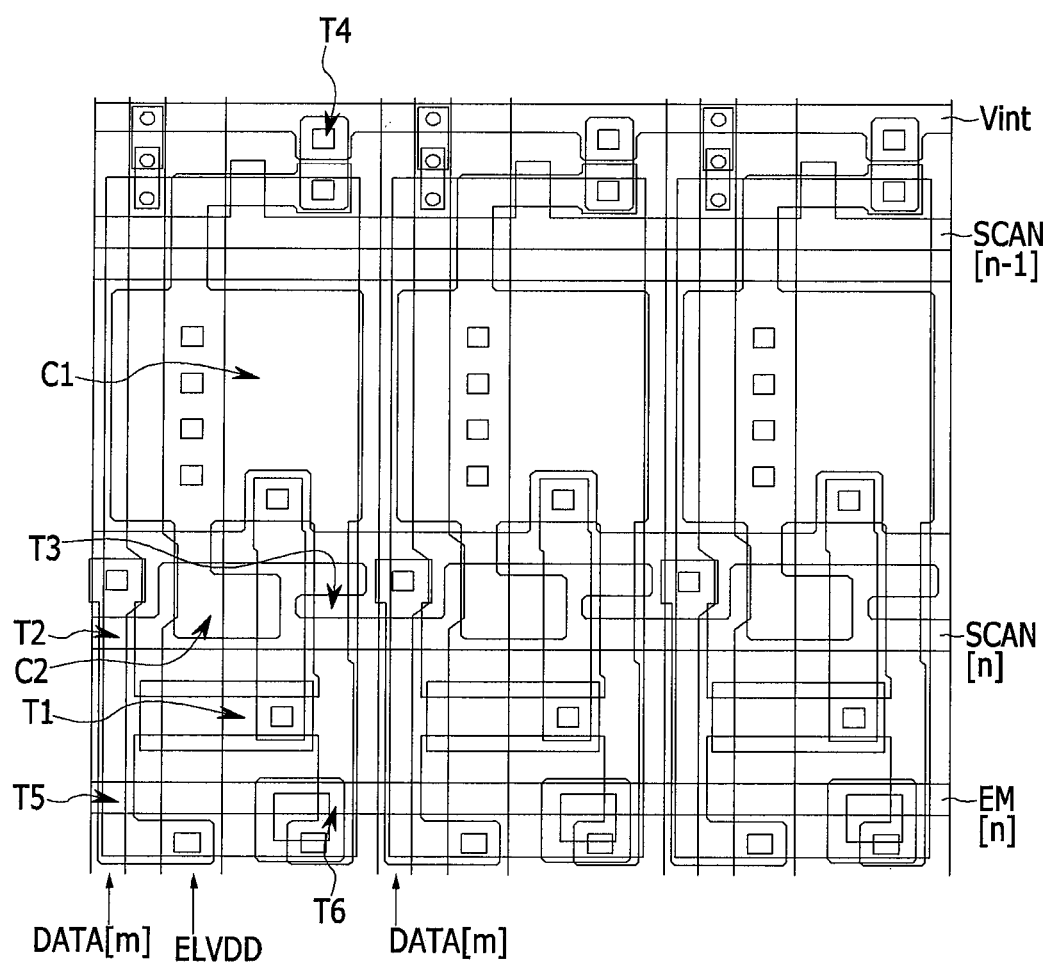
FIG. 4 is another example of an enlarged partial view of part "A" of FIG. 1.
Figure 5:
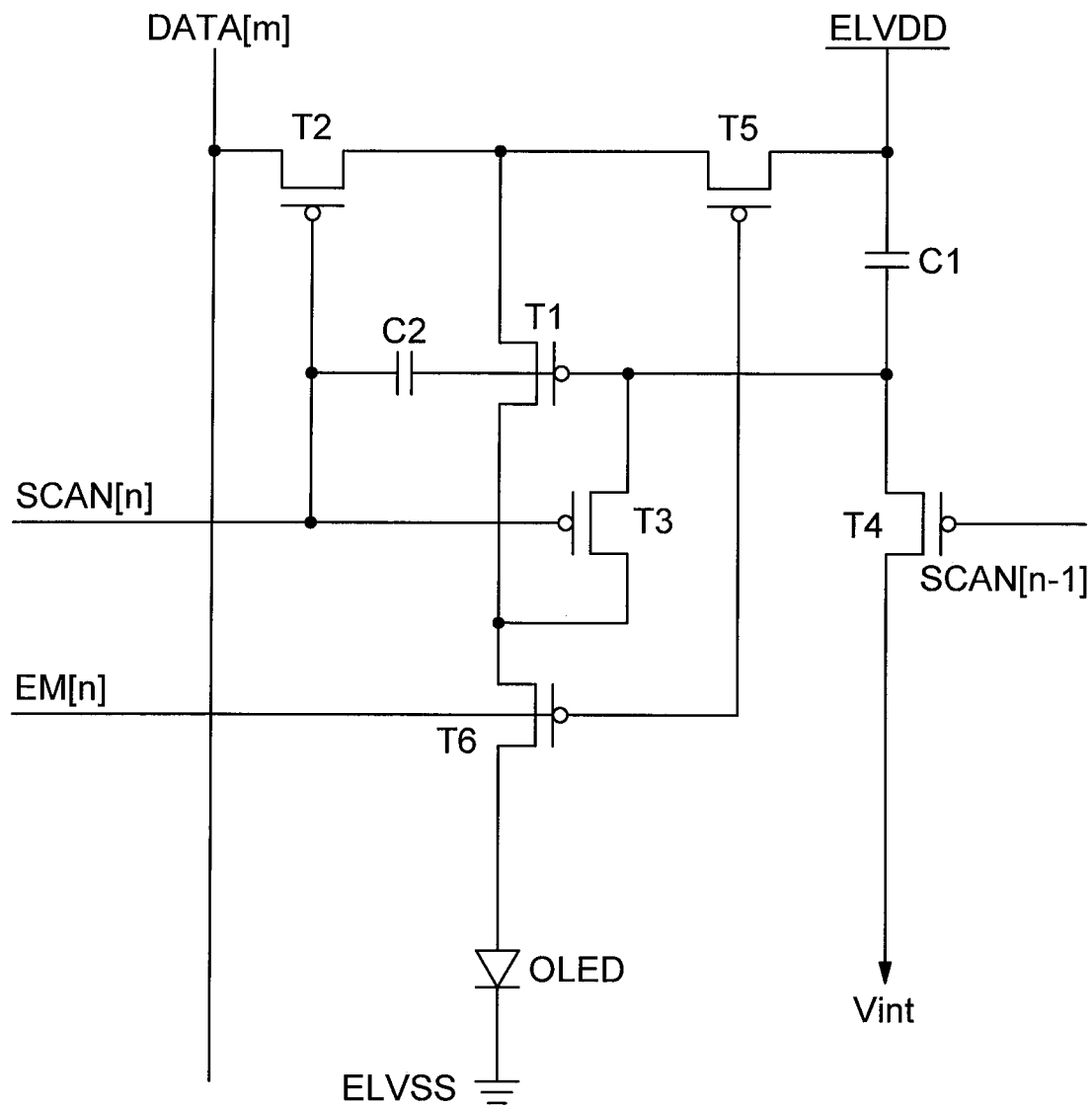
FIG. 5 is an equivalent circuit diagram of a pixel illustrated in FIG. 4.

In detail, FIG. 4 is another example of an enlarged partial view of part "A" of FIG. 1 and shows a layout of another implementation of a pixel included in the OLED display 100 according to the first embodiment.

FIG. 4 illustrates three pixels. FIG. 5 is an equivalent circuit diagram of one of the pixels illustrated in FIG. 4.

Each pixel illustrated in FIG. 4 may include a driving TFT T1, a switching TFT T2, one or more capacitors C1 and C2, a scan line SCAN[n], a data line DATA[m], a first power line ELVDD, a second power line ELVSS, and an OLED.

The pixel may also include a further scan line SCAN[n-1], emission control line EM[n], initialization voltage line Vint, and TFTs T3, T4, T5, and T6 including a compensation TFT T3. Initialization voltage VIN transmitted through the initialization voltage line Vint may initialize the driving TFT T1.

The switching TFT T2 may be switch-operated according to scan signals transmitted through the scan line SCAN[n]. For example, a gate electrode of the switching TFT T2 may be coupled or connected to the scan line SCAN[n]. A source electrode of the switching TFT T2 may be coupled or connected to the data line DATA[m]. The scan line SCAN[n] and the data line DATA[m] may be located or disposed in respective directions intersecting (crossing) each other. A drain electrode of the switching TFT T2 may be electrically coupled or connected to a source electrode of the driving TFT T1 and the first power line ELVDD.

The driving TFT T1 may receive data signals according to a switching operation of the switching TFT T2 so as to transmit a driving current to the OLED.

A gate electrode of the driving TFT T1 may be coupled or connected to one electrode of the first capacitor C1. The other electrode of the first capacitor C1 may be coupled or connected to the first power line ELVDD.

The first power line ELVDD may be located or disposed parallel or substantially parallel to the data line DATA[m]. A drain electrode of the driving TFT T1 may be electrically coupled or connected to the anode 211 of the OLED. The second power line ELVSS may be coupled or connected to the cathode 213 of the OLED. Therefore, the OLED may emit light by receiving the driving current from the driving TFT T1.

The OLED may include the anode 211 that injects holes, the cathode 213 that injects electrons, and the light emission layer 212 between the anode 211 and the cathode 213.

Hereinafter, an operating process for the pixel illustrated in FIG. 4 will be described in more detail with reference to FIG. 5.

First, while the TFT T4 is in the ON state according to scan signals transmitted through the scan line SCAN[n-1], the initialization voltage VIN may be supplied to an end of the first capacitor C1 and the gate electrode of the driving TFT T1.

Next, the switching TFT T2 and the compensation TFT T3 may be turned on according to scan signals transmitted through the scan line SCAN[n]. While the switching TFT T2 and the compensation TFT T3 are in the ON state, a data voltage transmitted through the data line DATA[m] may be transmitted to the source electrode of the driving TFT T1, and the driving TFT T1 may be diode-connected or diode-coupled.

Then, a voltage obtained by subtracting a threshold voltage of the driving TFT T1 from the data voltage may be applied to the gate electrode and the source electrode of the driving TFT T1.

Next, the TFTs T5 and T6 may be turned on by emission control signals transmitted through the emission control line EM[n], and a voltage of the gate electrode of the driving TFT T1 may be boosted by an increase of the scan signals transmitted through the scan line SCAN[n].

While the two TFTs T5 and T6 are in the ON state, a voltage of the first power line ELVDD may be supplied to the source electrode of the driving TFT T1, and a driving current according to a gate-source voltage difference may flow to the driving TFT T1. The driving current may be transmitted to the anode of the OLED through the turned-on TFT T6.

Hereinafter, configurations of the common electrode line 230 will be described in further detail with reference to FIGS. 6A to 6D.

FIGS. 6A to 6D are partial plan views illustrating common electrode lines of display devices according to the first embodiment to a fourth embodiment of the present invention.

The common electrode line 230 may include a line unit 235 continuously located or disposed outside the display area along the display area and a protrusion 236 protruding from the line unit 235 towards the sealing area 220.

The line unit 235 may be in contact (e.g., direct contact) with the common electrode coupling portion 231. An end portion of the line unit 235, which is located towards the display area 101, may be covered and protected by the planarization layer. In some embodiments, an end portion of the line unit 235, which is located towards the sealing area 220, may be exposed for a predetermined or set period of time in the process of manufacturing a display device and the protrusion 236 may be formed in the exposed region.

Figure 6A:
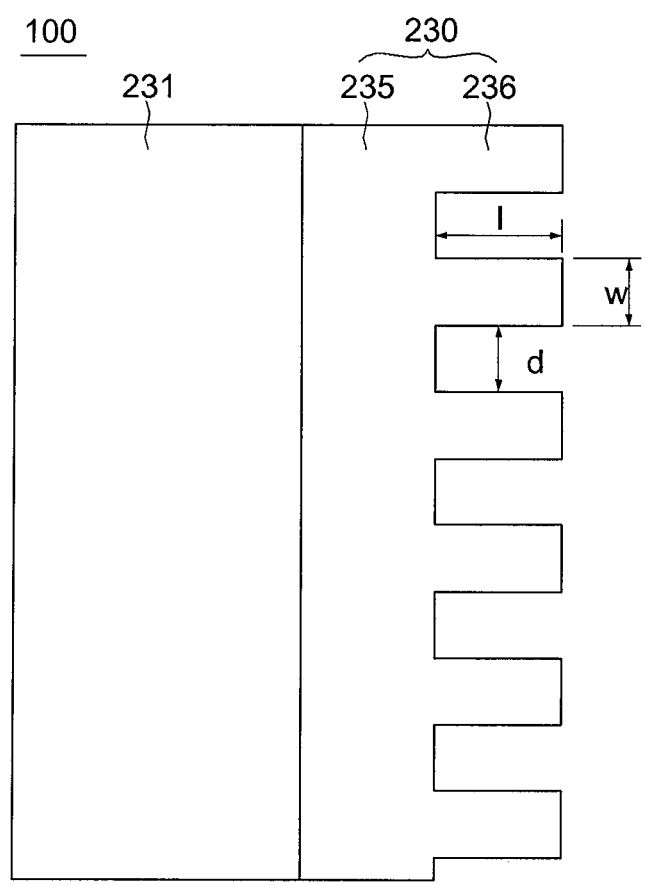
FIGS. 6A to 6D are partial plan views illustrating common electrode lines of display devices according to the first embodiment to a fourth embodiment of the present invention.
Figure 6B:
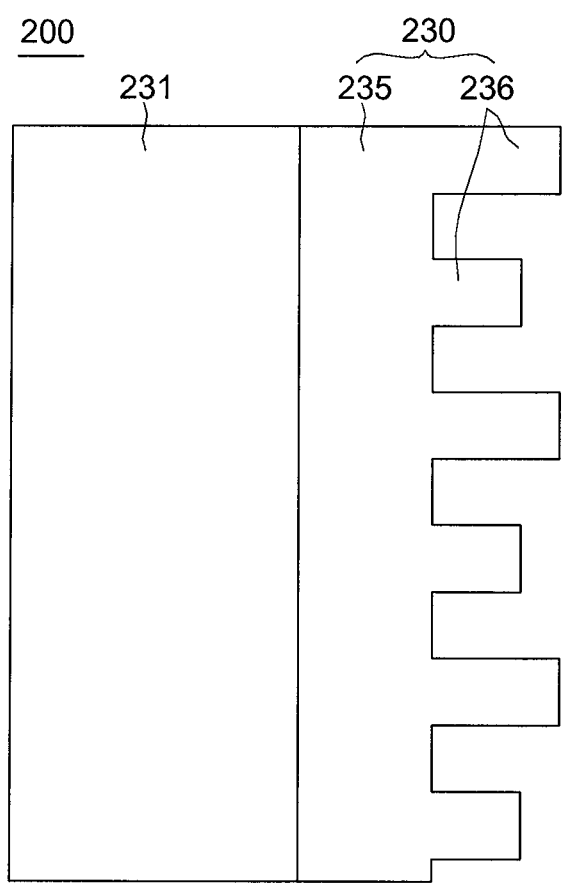
Figure 6C:
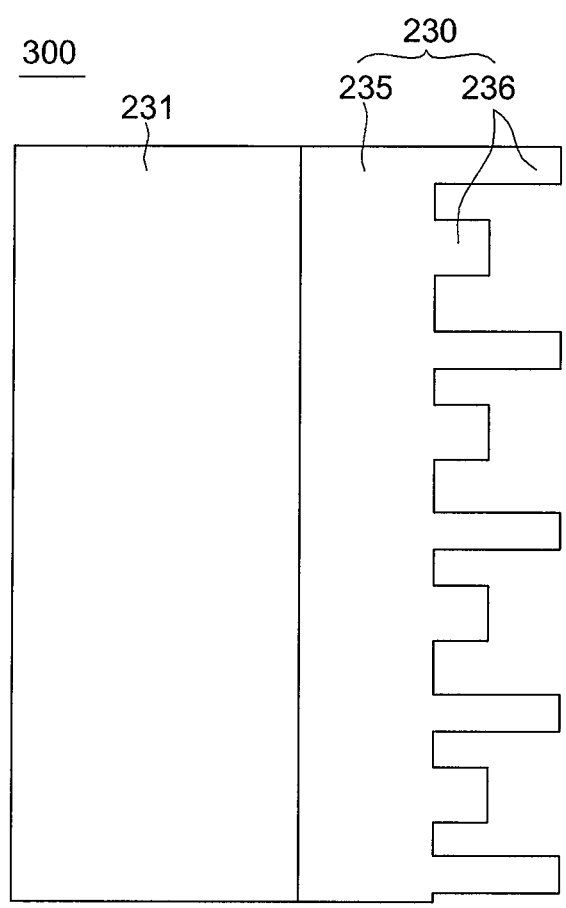
Figure 6D:
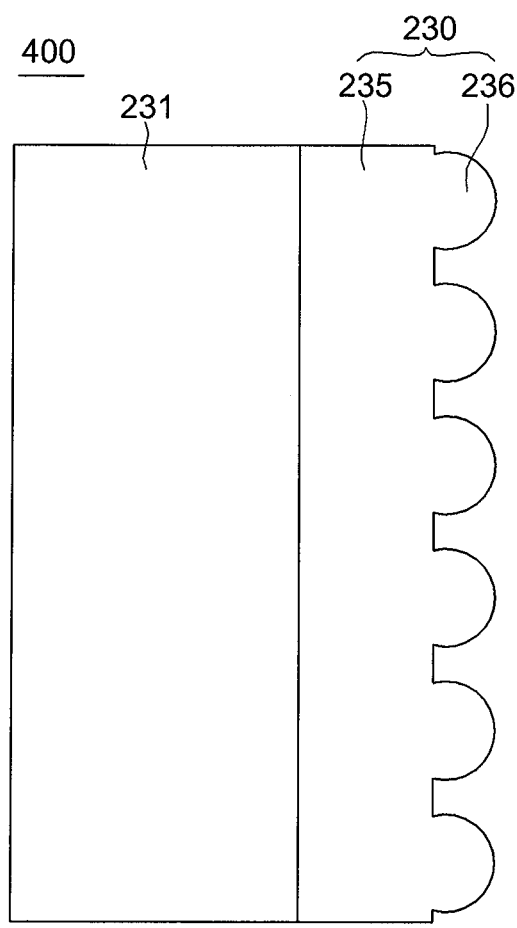

In more detail, FIG. 6A is an enlarged plan view of the common electrode line 230 of the OLED display 100 according to the first embodiment and the common electrode coupling portion 231 coupled to the common electrode line 230. FIGS. 6B to 6D are enlarged plan views of the common electrode lines 230 of OLED displays according to the second through fourth embodiments, respectively, and the common electrode coupling portions 231 coupled to the common electrode lines 230.

As illustrated in FIG. 6A, the common electrode line 230 may include the line unit 235 and a plurality of protrusions 236 that protrude from the line unit 235 in the opposite direction of the display area (e.g., in a direction away from the display area). Referring to FIG. 6A, the plurality of protrusions 236 may be spaced apart from each other by a predetermined or set distance.

Each protrusion 236 may have a length l and a width w. The length l may be equal to a distance that protrudes from the line unit 235 in the opposite direction of the display area (e.g., the direction away from the display area), and the width w may be perpendicular or substantially perpendicular to the length l. A distance d between the protrusions 236 may be equal to a distance between the neighboring protrusions.

The length l and width w of the protrusion 236 and the distance d between the neighboring protrusions 236 may be identical to each other or different from each other.

The common electrode line 230 illustrated in FIG. 6A may have the plurality of protrusions 236 that have the predetermined or set length l and width w and the predetermined or set distance d therebetween.

An OLED display 200 may include a common electrode line 230 illustrated in FIG. 6B, which may have a plurality of protrusions 236 that have different lengths l from each other. For example, as shown in FIG. 6B, a first set of protrusions 236 may have lengths that are different from lengths of a second set of protrusions 236. In some embodiments, the lengths of the first set may be the same as one another, and the lengths of the second set may be the same as one another.

An OLED display 300 may include a common electrode line 230 illustrated in FIG. 6C, which may have a plurality of protrusions 236 that have different lengths l and widths w from each other and irregular (e.g., non-predetermined) distances d therebetween. For example, as shown in FIG. 6C, a first set of protrusions 236 may have lengths and widths that are different from lengths and widths of a second set of protrusions 236. In some embodiments, the lengths of the first set may be the same as one another, the widths of the first may be the same as one another, the lengths of the second set may be the same as one another, and the widths of the second set may be the same as one another.

An OLED display 400 may include a common electrode line 230 illustrated in FIG. 6D, which may have a protrusion 236 that is semicircular in shape.

In a display device according to embodiments of the present invention, the configurations of the common electrode line 230 are not limited to FIGS. 6A to 6D, but can be changed in various ways. The shapes of the protrusion 236 are not limited to a quadrilateral or semicircle as shown in FIGS. 6A to 6D, but can be a polygon such as triangle, pentagon, and the like.

The common electrode line 230 may be patterned into a predetermined or set shape in the process of forming the data wire including the source and drain electrodes 176 and 177. The length l of one protrusion 236 may be larger than the distance d between the one protrusion 236 and an adjacent protrusion 236, and then layer-forming materials may easily flow out of or around the protrusions 236 due to an attractive force exerted between the layer-forming materials applied to the one protrusion 236 and applied to the adjacent protrusion 236, respectively.

The length l of the protrusion 236 may vary depending on the size of a display device and the width of the common electrode line 230. Therefore, the length l of the protrusion 236 may be in a range of 2 μm to 2000 μm, but the length l is not limited thereto. In the case of a large display device, the length l of the protrusion 236 may be greater than 2000 μm. Further, the distance d between the protrusions 236 may be in a range of 1 μm to 1000 μm, but the distance d is not limited thereto.

Hereinafter, a fifth embodiment of the present invention will be described with reference to FIG. 7, and in order to avoid repetitions, only differences between the above-described embodiments and the fifth embodiment will be described without repeating the descriptions of the components of the first embodiment.

Figure 7:
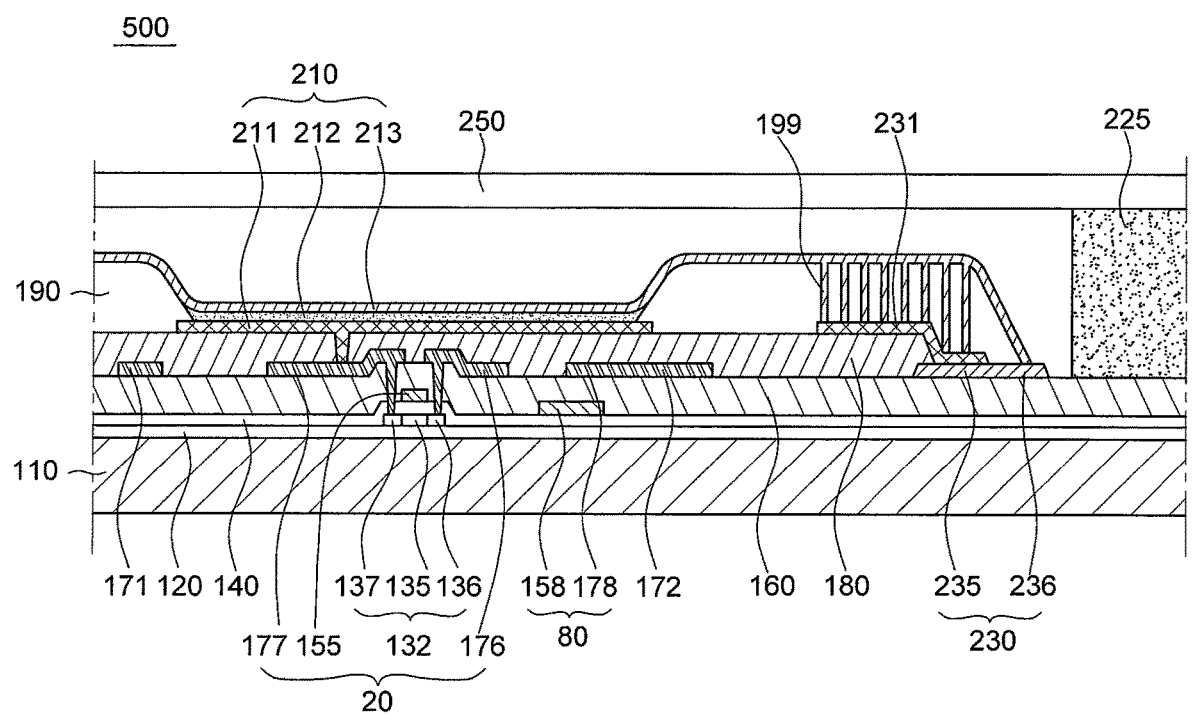
FIG. 7 is a cross-sectional view illustrating a display device according to a fifth embodiment of the present invention.

Referring to FIG. 7, an OLED display 500 may include a common electrode coupling portion 231 and a pixel defining layer (PDL) 190 that overlaps the common electrode line 230. The PDL 190 may have a contact opening (e.g., hole) 199 in a region corresponding to the common electrode coupling portion 231. The common electrode 213 and the common electrode coupling portion 231 may be coupled to each other through the contact opening (e.g., hole) 199, and accordingly power supplied to the common electrode line 230 may be transmitted to the common electrode 213 (e.g., through the contact opening or hole 199). In this case, the PDL 190 may or may not overlap the protrusion 236 of the common electrode line 230.

Hereinafter, a method for manufacturing the OLED display 100 according to the first embodiment will be described with reference to FIGS. 8A to 8H.

Figure 8A:
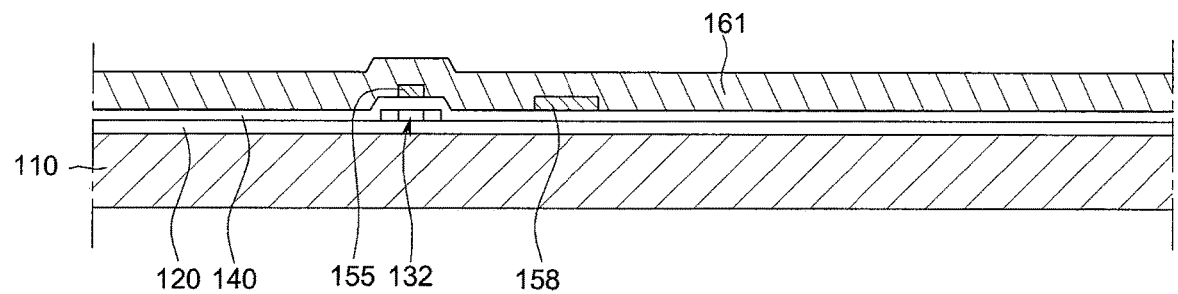
FIGS. 8A to 8H are cross-sectional views illustrating sequential manufacturing processes of the display device according to the first embodiment of the present invention.

As illustrated in FIG. 8A, a buffer layer 120 may be formed on the substrate 110, which includes or is made of glass or plastic, a semiconductive layer 132 may be formed on the buffer layer 120, a gate insulating layer 140 may be formed on the semiconductive layer 132, a gate wire including a gate electrode 155 and a first capacitor plate 158 may be formed on the gate insulating layer 140, and a photosensitive material may be applied to the gate wire in order to form a material layer 161 for an interlayer insulating layer.

Figure 8B:
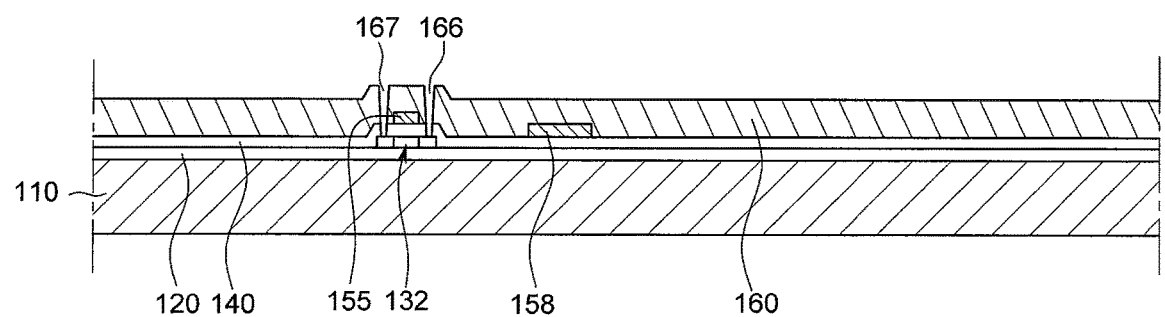

Next, as illustrated in FIG. 8B, the material layer 161 for an interlayer insulating layer and the gate insulating layer 140 may be partially removed to form a source contact opening (e.g., hole) 166 and a drain contact opening (e.g., hole) 167 that allows parts of source and drain areas of the semiconductive layer 132 to be exposed.

Figure 8C:
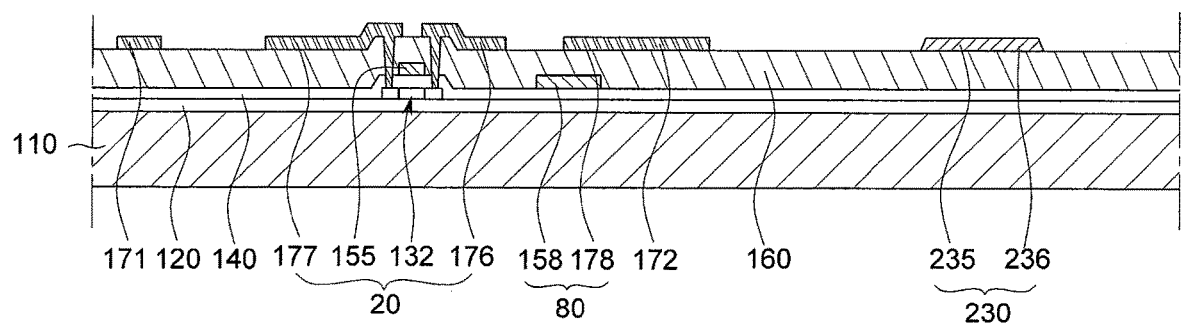

Next, as illustrated in FIG. 8C, a source electrode 176 and a drain electrode 177 that are coupled to the semiconductive layer 132 through the source contact opening (e.g., hole) 166 and the drain contact opening (e.g., hole) 167, respectively, may be formed, and a data line 171, a second capacitor plate 178, and a power line 172 may also be formed such that a data wire may be formed. In addition, the common electrode line 230 may be formed on an interlayer insulating layer 160 of the non-display area 102.

The common electrode line 230 may include or be formed of the same or substantially the same material as that of the source and drain electrodes 176 and 177 by the same or substantially the same process as the source and drain electrodes 176 and 177. In this case, the common electrode line 230 may be patterned to include a line unit 235 and a protrusion 236.

Figure 8D:
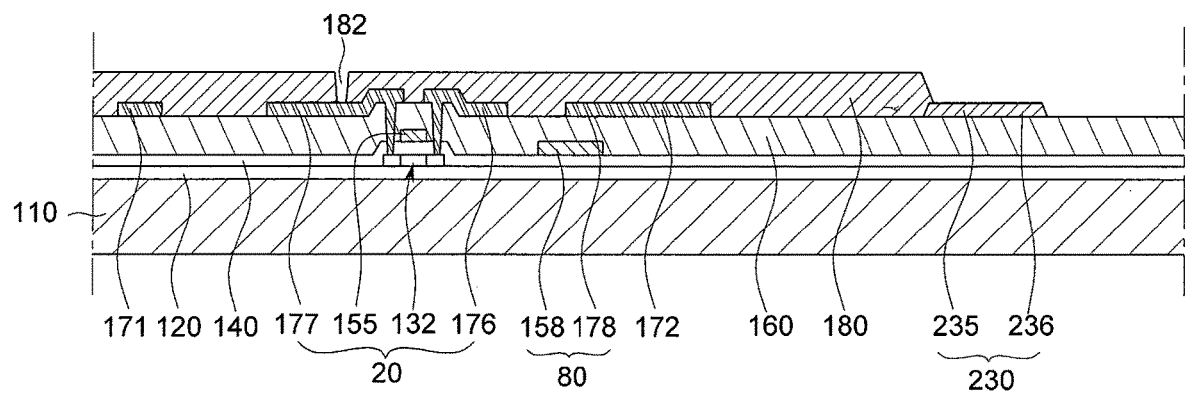

Next, as illustrated in FIG. 8D, a planarization layer 180 having a pixel contact opening (e.g., hole) 182 may be formed. In order to form the planarization layer 180, a planarization layer-forming material may be applied to the data wire and the common electrode line 230 so as to form a material layer for a planarization layer, and then photolithography may be performed utilizing a pattern mask (e.g., to form the pixel contact opening or hole 182). Examples of the planarization layer-forming photosensitive material may include silicon nitride ($SiN_x$) or silicon oxide ($SiO_2$), and/or a photosensitive resin composition.

Figure 8E:
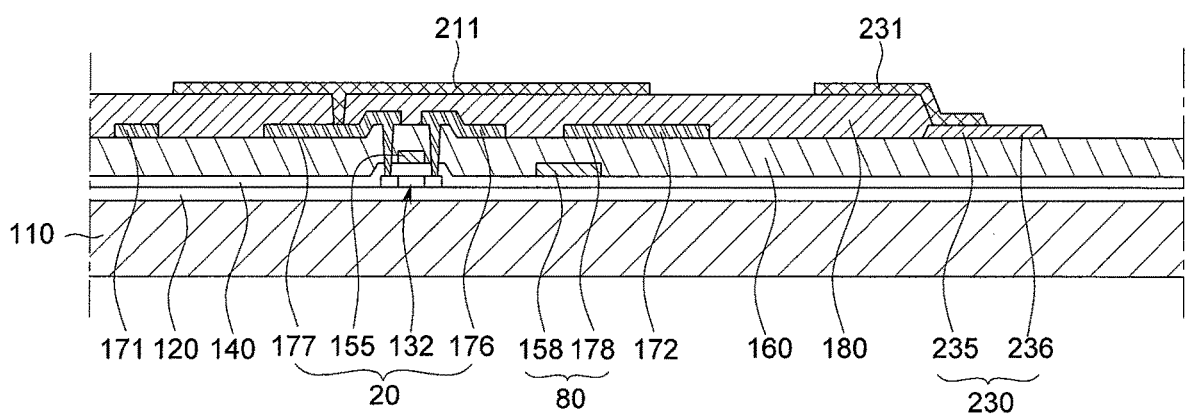

Next, as illustrated in FIG. 8E, a pixel electrode 211 and a common electrode coupling portion 231 coupled to the common electrode line 230 may be formed on the planarization layer 180. The pixel electrode 211 may be coupled to the drain electrode 177 of a driving TFT 20 through the pixel contact opening (e.g., hole) 182. The common electrode coupling portion 231 may extend to an upper portion of the planarization layer 180. The common electrode coupling portion 231 may include or be formed of the same or substantially the same material as the pixel electrode 211 by the same or substantially the same process as the pixel electrode 211.

In one embodiment, the pixel electrode 211 and the common electrode coupling portion 231 may be formed by a method including an act of forming a conductor material layer by forming a metal layer on the planarization layer 180 and the common electrode line 230 and laminating a transparent conductive oxide layer on the metal layer and an act of patterning the conductor material layer.

The common electrode line 230 may include the line unit 235 and a plurality of protrusions 236 that protrude from the line unit 235 in the opposite direction of the display area (in the direction away from the display area). Each protrusion 236 may have a length l and a width w. The length l may be equal to a distance that protrudes from the line unit 235 in the opposite direction of the display area, and the width w may be perpendicular or substantially perpendicular to the length l. A distance d between the protrusions 236 may be equal to a distance between the neighboring protrusions.

The length l and width w of the protrusion 236 and the distance d between the neighboring protrusions 236 may be identical to each other or different from each other.

Figure 8F:
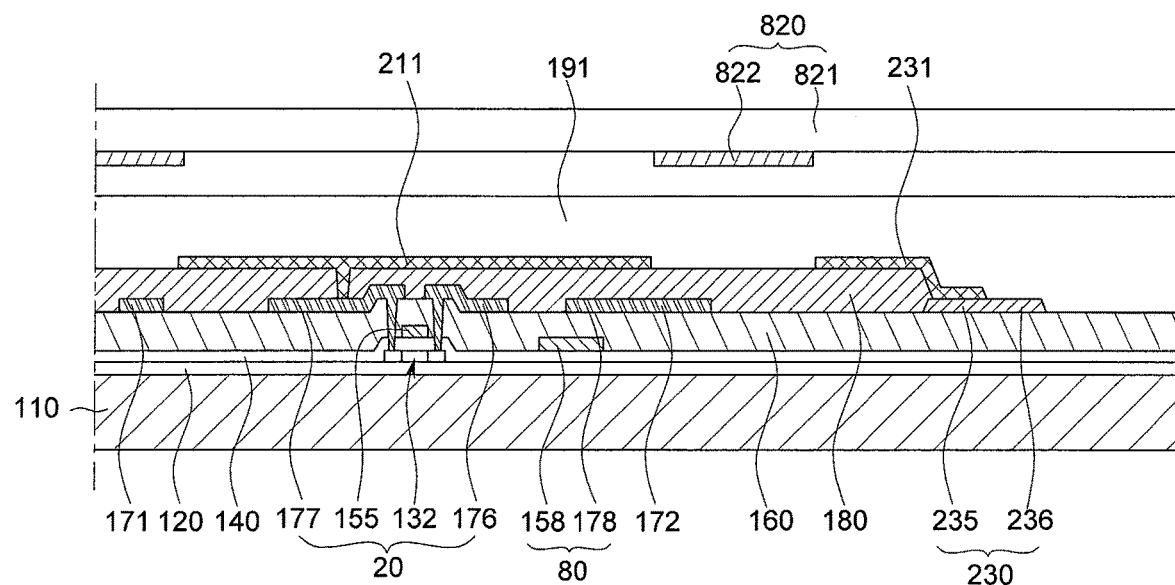

Next, as illustrated in FIG. 8F, a photosensitive organic material may be applied to the pixel electrode 211, the common electrode coupling portion 231, the common electrode line 230, and the entire or substantially the entire surface of the exposed planarization layer 180 so as to form an organic material layer 191 for a pixel defining layer, and then photolithography may be performed utilizing a pattern mask 820.

The pattern mask 820 may include a mask substrate 821 and a light-shielding pattern 822 on the mask substrate 821. An exposed part of the organic material layer 191 for a pixel defining layer may be removed in a developing process and a non-exposed part thereof may still remain after the developing process, but the present disclosure is not limited thereto. For example, in some embodiments, the exposed part may remain and the non-exposed part may be removed according to the kind of the photosensitive organic material.

Examples of the photosensitive organic material may include polyacrylate resins and/or polyimide resins. In order to form the organic material layer 191 for a pixel defining layer, a slit nozzle may be used to apply the photosensitive organic material, such as polyacrylate resins and/or polyimide resins. The common electrode line 230 may include the protrusion 236. Thus the photosensitive organic material may be temporarily accumulated on the protrusion 236 of the common electrode line 230, and thereafter it may be combined with the photosensitive organic material accumulated on the adjacent protrusion 236 and the combined photosensitive organic materials may be dispersed into the neighboring sealing area 220, or the like. Therefore, the photosensitive organic material may not be accumulated in a single place or location, thereby forming a uniform or substantially uniform organic layer.

Figure 8G:
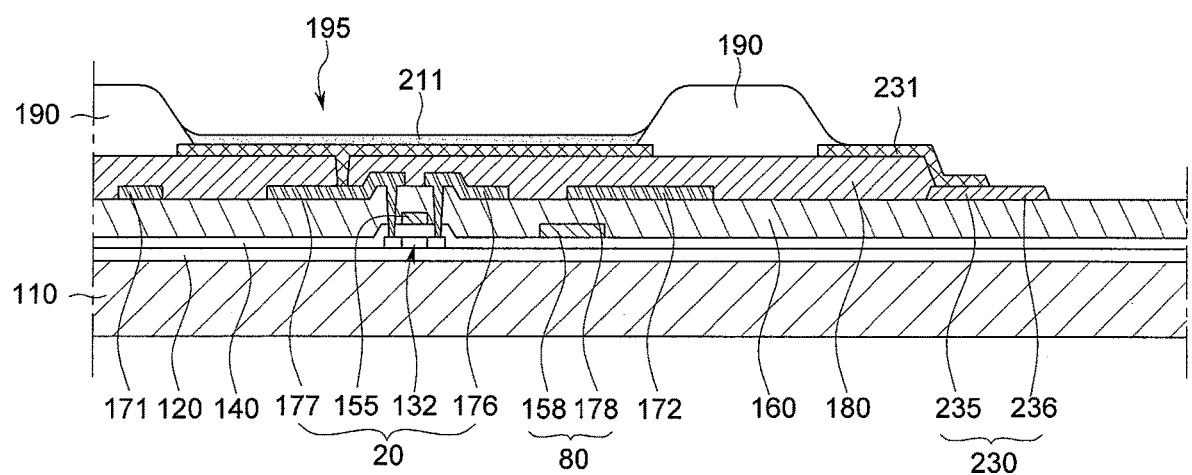

Next, as illustrated in FIG. 8G, a pixel defining layer (PDL) 190 having an opening 195 may be formed through a developing process. The PDL 190 may be a stable layer formed utilizing thermal curing or photocuring. The opening 195 of the DL 190, which is formed on the pixel electrode 211, may correspond to a pixel area. Further, the common electrode coupling portion 231 may be partially exposed.

Figure 8H:
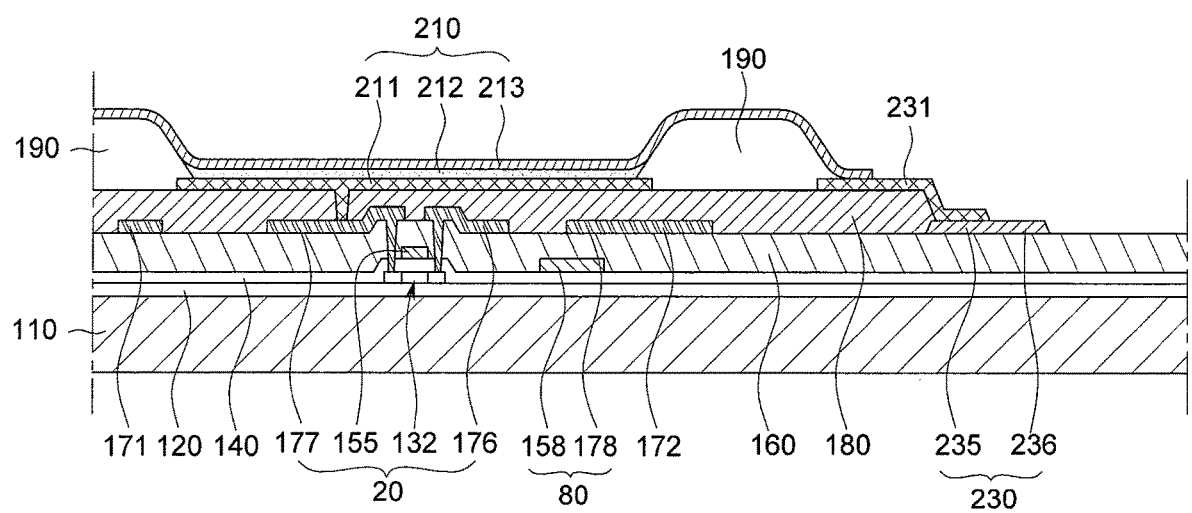

Next, as illustrated in FIG. 8H, a light emission layer 212 may be formed on the pixel electrode 211 that is exposed through the opening 195 of the PDL 190, and a common electrode 213 may be formed on the light emission layer 212 and the PDL 190. The common electrode 213 may be in contact (e.g., direct contact) with the common electrode coupling portion 231.

Thereafter, a sealing member 250 may be formed on the common electrode 213 such that the OLED display 100 as illustrated in FIG. 3 may be manufactured.

Hereinafter, features of forming the protrusion 236 of the common electrode line 230 will be described with reference to FIGS. 9A and 9B.

Figure 9A:
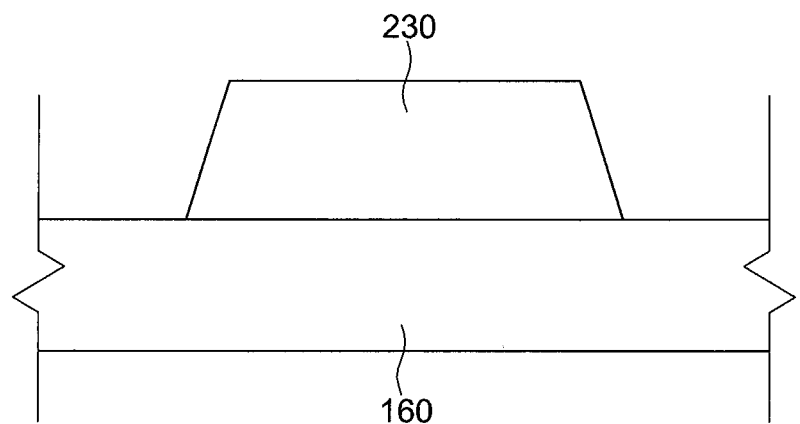
FIGS. 9A and 9B are cross-sectional views illustrating a common electrode line.

FIG. 9A is a cross-sectional view illustrating the common electrode line 230 on the interlayer insulating layer 160. The common electrode line 230 formed with the data wire may have a positive tapered cross-section as illustrated in FIG. 9A.

Figure 9B:
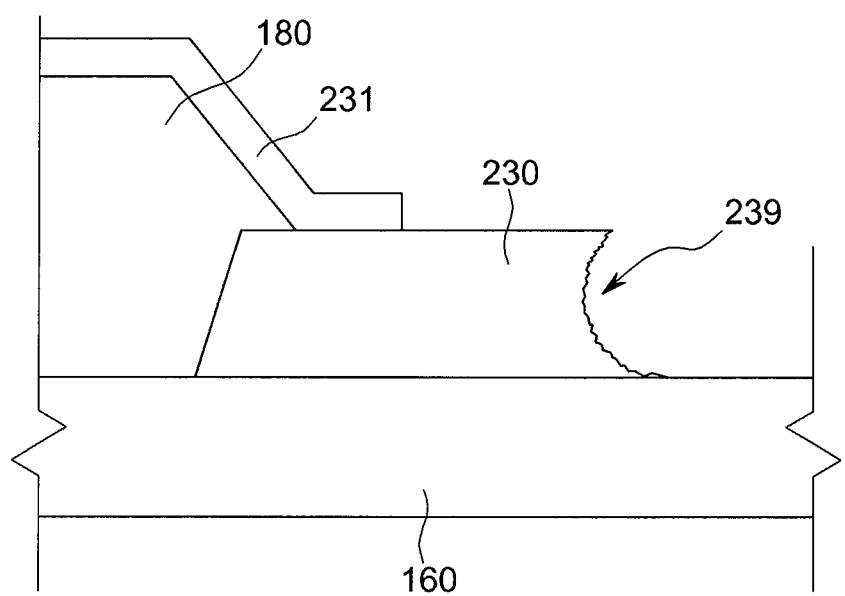

The common electrode line 230 may include or be formed of a metal and the planarization layer 180 may be formed only on one end portion (e.g., left side) of the common electrode line 230 (as shown in FIG. 9B). Meanwhile, developing may be performed in the process of forming the planarization layer 180 after the common electrode line 230 is formed, and developing and etching may be performed in the process of forming the pixel electrode 211 and the common electrode coupling portion 231 on the planarization layer 180. While the developing and etching are repeatedly performed, the exposed end portion (e.g., the right side) of the common electrode line 230 is likely to be damaged. As a result, the exposed end portion of the common electrode line 230 may have an inverse-tapered shape 239 as illustrated in FIG. 9B.

Figure 10:
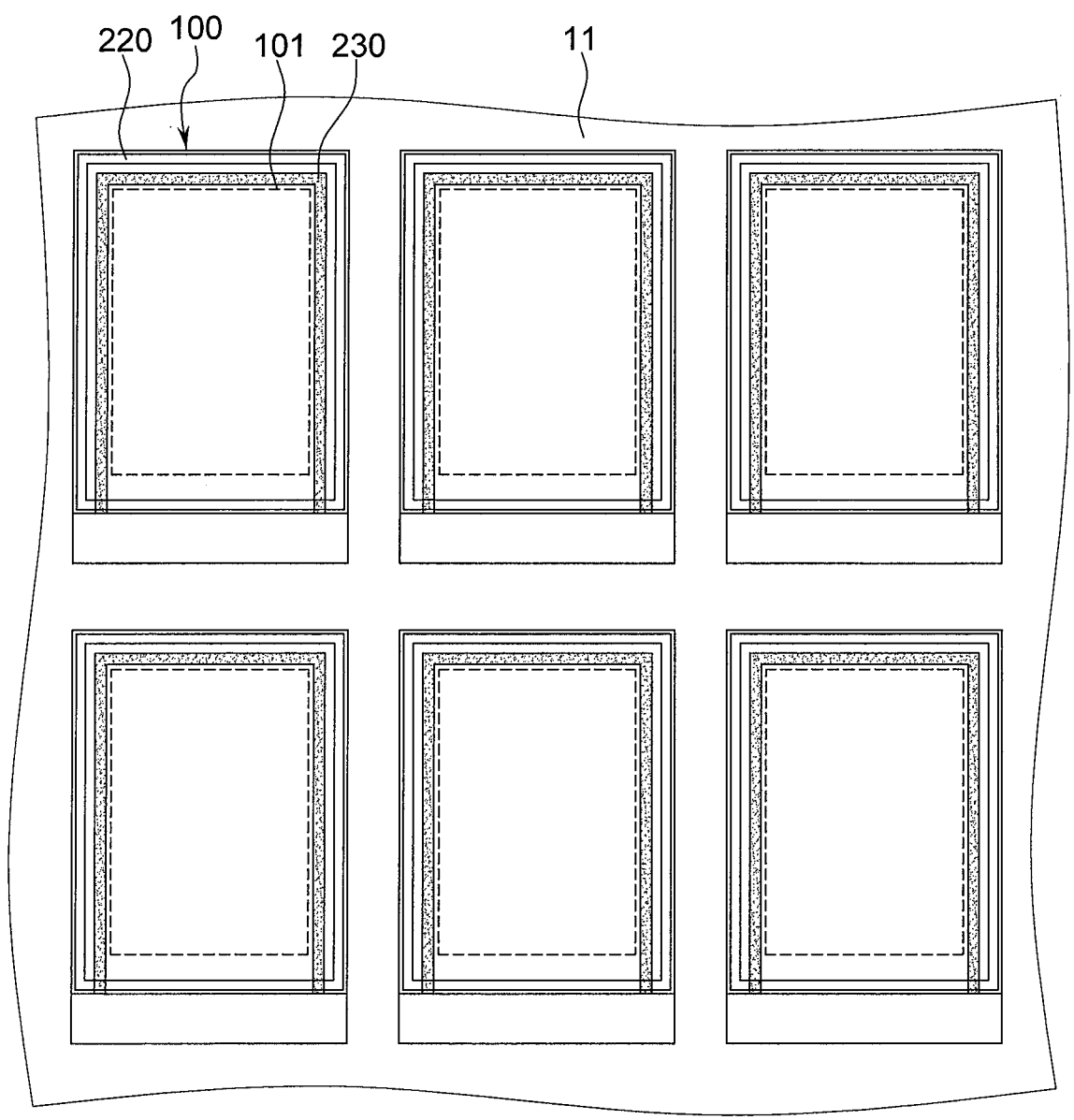
FIG. 10 is a plan view illustrating a mother glass for manufacturing a plurality of display devices.

In the meantime, in order to form the PDL 190, the photosensitive organic material may be applied to the pixel electrode 211 and the common electrode line 230. In this case, the photosensitive organic material should not be accumulated in a particular region but should flow so as to form the PDL 190 to be smooth and have a uniform or substantially uniform thickness. As illustrated in FIG. 10, in an embodiment of a process of manufacturing a plurality of display devices utilizing one mother glass, the photosensitive organic material applied to the entire or substantially the entire mother glass 11 should flow uniformly or substantially uniformly on the mother glass 11.

In the case where an end portion of the common electrode line 230 has a positive tapered shape as illustrated in FIG. 9A, the photosensitive organic material may easily flow down a slope of the end portion of the common electrode line 230. However, when the end portion of the common electrode line 230 has an inverse-tapered shape 239, and thus, is damaged as illustrated in FIG. 9B, the photosensitive organic material may not easily flow down the damaged end portion of the common electrode line 230 and may be accumulated at the end portion of the common electrode line 230. Therefore, a step (e.g., a defect) may occur in the organic material layer for a pixel defining layer.

Figure 11:
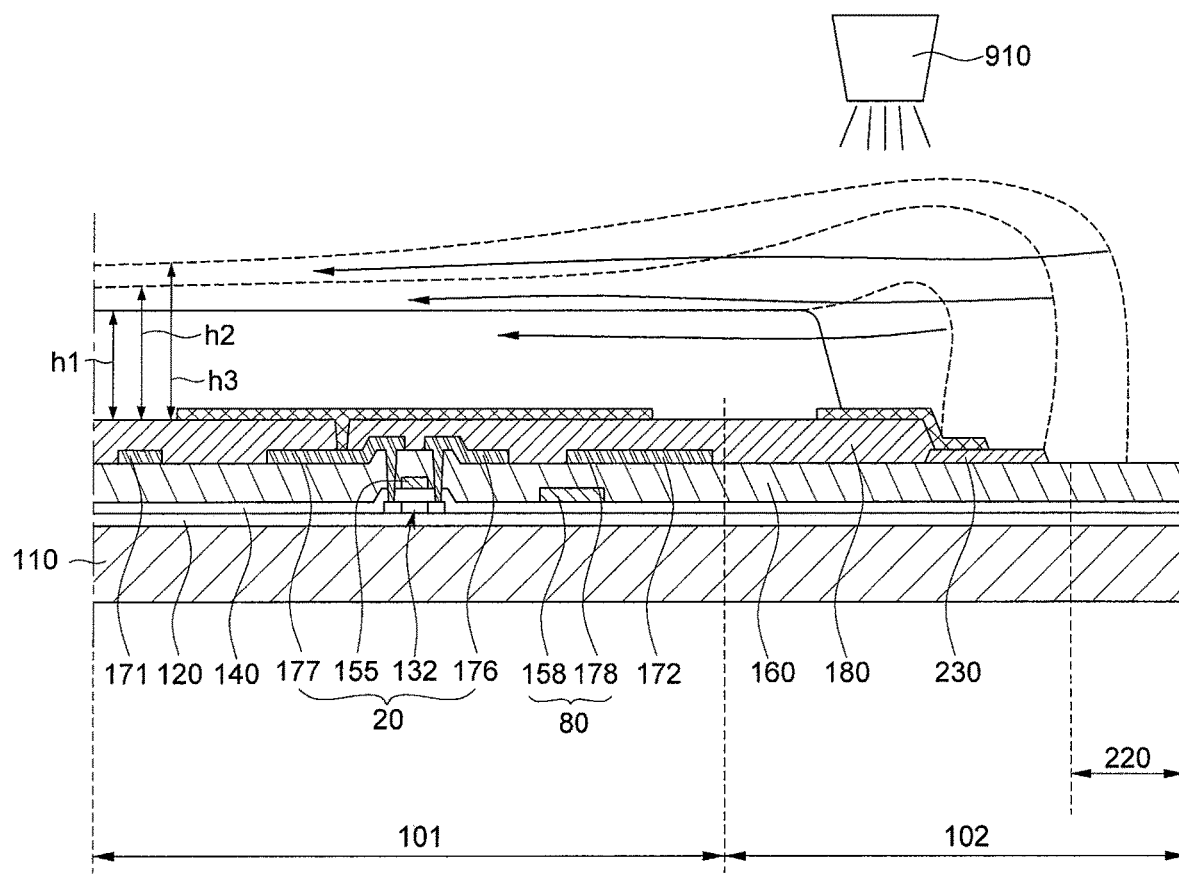
FIG. 11 is a cross-sectional view illustrating application of an organic material for forming a pixel defining layer.

FIG. 11 is a cross-sectional view illustrating application of embodiments of a photosensitive organic material for a pixel defining layer. As illustrated in FIG. 11, when the photosensitive organic material supplied from a nozzle 910 fails to easily flow down an end portion of the common electrode line 230, the photosensitive organic material may be accumulated at the end portion of the common electrode line 230 and the accumulated photosensitive organic material may reversely flow toward the display area 101 as shown with arrows. As described above, when the photosensitive organic material is accumulated at the end portion of the common electrode line 230, a height of the photosensitive organic material which should be suitably or desirably h1 may become h2 or h3. Until the height of the photosensitive organic material becomes h2 or h3, the photosensitive organic material accumulated at the end portion of the common electrode line 230 may not flow to an adjacent region, and then a step (e.g., a defect) may occur in the organic material layer for the pixel defining layer. Therefore, the pixel defining layer may fail to be formed to have a uniform or substantially uniform layer thickness. Accordingly, the OLED display 100 may have poor quality in light emission.

According to some embodiments of the present invention, when an end portion of the common electrode line 230 includes a protrusion 236, a photosensitive organic material accumulated on one protrusion 236 may be combined with a photosensitive organic material accumulated on the adjacent protrusion 236 and the combined photosensitive organic materials may easily flow, and thus it may be accumulated to have a suitable height at the end portion of the common electrode line 230. Consequently, a pixel defining layer that is smooth and has a uniform or substantially uniform thickness may be obtained.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, and the invention is intended to cover various modifications and equivalent arrangements included within the scope and spirit of the appended claims, and equivalents thereof.

What is claimed is:

1. A display device comprising:
    a substrate comprising a display area and a non-display area;
    a common electrode line in the non-display area of the substrate;
    a planarization layer on a part of the common electrode line; and
    a common electrode coupling portion on the planarization layer and coupled to the common electrode line,
    wherein the common electrode line comprises:
    an electrode line extending in a first direction parallel to a side of the non-display area, the electrode line having first and second sides defining a width of the electrode line in a second direction perpendicular to the first direction, the first side being adjacent to the display area and overlapping with the planarization layer, the second side being opposite to the first side and spaced apart from the planarization layer in a plan view; and
    a plurality of protrusions that protrude from the second side of the electrode line and are spaced apart from the planarization layer and common electrode coupling portion in a plan view,
    wherein the display area comprises a display element comprising:
    a pixel electrode on the planarization layer;
    a light emission layer on the pixel electrode; and
    a common electrode on the light emission layer, the common electrode being coupled to the common electrode line.

2. The display device of claim 1, wherein the common electrode line comprises a metal.

3. The display device of claim 1, wherein the display area comprises a thin film transistor comprising a gate electrode, a semiconductive layer, a source electrode, and a drain electrode, and the common electrode line comprises the same as the source and drain electrodes.

4. The display device of claim 1, wherein the plurality of protrusions are spaced apart from each other by a set distance.

5. The display device of claim 1, wherein the plurality of protrusions are spaced apart from each other by different distances.

6. The display device of claim 1, wherein each of the plurality of protrusions has a length in the second direction and the length is larger than the distance in the first direction between the adjacent protrusions.

7. The display device of claim 6, wherein the length is in a range of 2 μm to 2000 μm.

8. The display device of claim 1, wherein the protrusion has a polygonal or semicircular shape.

9. The display device of claim 1, wherein the common electrode coupling portion comprises the same material as the pixel electrode.

10. The display device of claim 1, further comprising a pixel defining layer on the substrate to define a pixel area,
    wherein the pixel electrode and the light emission layer are in the pixel area.

11. The display device of claim 1, wherein a distance between the adjacent ones of the plurality of protrusions is in a range of 1 μm to 1000 μm.

12. A method for manufacturing a display device, the method comprising:
    forming a display area and a non-display area on a substrate;
    forming a common electrode line in the non-display area on the substrate;
    forming a planarization layer on a part of the common electrode line; and
    forming a common electrode coupling portion on the planarization layer and coupled to the common electrode line,
    wherein the common electrode line comprises:
    an electrode line extending in a first direction along a side of the non-display area, the electrode line having a first edge and a second edge defining a width of the electrode line, the first edge being adjacent to the display area and overlapping with the planarization layer, the second edge being opposite to the first edge and spaced apart from the planarization layer in a plan view; and
    a plurality of protrusions that protrude from the second edge the electrode line and are spaced apart from the planarization layer and common electrode coupling portion in a plan view,
    wherein the forming of the display area comprises forming one or more display elements,
    wherein the forming of the one or more display elements comprises:
    forming a pixel electrode on the planarization layer;
    forming a light emission layer on the pixel electrode; and
    forming a common electrode on the light emission layer, the common electrode being coupled to the common electrode line.

13. The method of claim 12, wherein the forming of the display area comprises forming a thin film transistor on the substrate, and the forming of the thin film transistor comprises:

forming a semiconductive layer;

forming a gate electrode that overlaps at least a portion of the semiconductive layer; and forming a source electrode coupled to the semiconductive layer and a drain electrode spaced apart from the source electrode and coupled to the semiconductive layer, wherein the forming of the source electrode and the drain electrode is performed utilizing the same process as the forming of the common electrode line.

14. The method of claim 12, further comprising forming a pixel defining layer after the forming of the pixel electrode.

15. The method of claim 12, wherein the plurality of protrusions are spaced apart from each other by a set distance.

16. The method of claim 12, wherein the plurality of protrusions are spaced apart from each other by different distances.

17. The method of claim 12, wherein the protrusion has a polygonal or semicircular shape.

18. The method of claim 12, wherein each of the plurality of protrusions has a length in the second direction and the length is larger than a distance in the first direction between the adjacent protrusions.

19. The method of claim 18, wherein the length is in a range of 2 μm to 2000 μm.

* * * * *